United States Patent
Cheng et al.

(10) Patent No.: US 11,398,507 B2
(45) Date of Patent: Jul. 26, 2022

(54) ARRAY SUBSTRATE, DISPLAY PANEL, AND MANUFACTURING METHOD OF THE ARRAY SUBSTRATE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Leilei Cheng, Beijing (CN); Bin Zhou, Beijing (CN); Jun Liu, Beijing (CN); Luke Ding, Beijing (CN); Qinghe Wang, Beijing (CN); Yongchao Huang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 203 days.

(21) Appl. No.: 16/919,903

(22) Filed: Jul. 2, 2020

(65) Prior Publication Data

US 2021/0066352 A1 Mar. 4, 2021

(30) Foreign Application Priority Data

Aug. 30, 2019 (CN) .......................... 201910817146.8

(51) Int. Cl.
*H01L 27/12* (2006.01)
*G02F 1/1333* (2006.01)
*G02F 1/1362* (2006.01)
*H01L 27/32* (2006.01)

(52) U.S. Cl.
CPC .... *H01L 27/1248* (2013.01); *G02F 1/133345* (2013.01); *G02F 1/136227* (2013.01); *H01L 27/1288* (2013.01); *H01L 27/3248* (2013.01)

(58) Field of Classification Search
CPC ............. H01L 27/1248; H01L 27/1288; H01L 27/3248; G02F 1/133345; G02F 1/136227
USPC ........................................................... 257/72
See application file for complete search history.

(56) References Cited

U.S. PATENT DOCUMENTS

| | | | |
|---|---|---|---|
| 6,136,642 A * | 10/2000 | Tan | H01L 27/10885 257/E27.088 |
| 10,162,236 B2 | 12/2018 | Wang et al. | |
| 2009/0250701 A1 * | 10/2009 | Kimura | H01L 29/78675 257/E33.053 |

(Continued)

FOREIGN PATENT DOCUMENTS

| | | |
|---|---|---|
| CN | 103456740 A | 12/2013 |
| CN | 105355630 A | 2/2016 |

(Continued)

*Primary Examiner* — Igwe U Anya
(74) *Attorney, Agent, or Firm* — Muncy, Geissler, Olds & Lowe, P.C.

(57) ABSTRACT

An array substrate includes an insulation layer and one or more stepped holes each penetrating through the insulation layer in a direction perpendicular to the insulation layer. Each stepped hole includes a first hole and a second hole under the first hole, a radius of the first hole at a bottom is a first radius, a radius of the second hole at a top is a second radius which is substantially smaller than the first radius, and a difference between the first radius and the second radius is 0.2 μm to 0.6 μm.

20 Claims, 6 Drawing Sheets

(56) References Cited

U.S. PATENT DOCUMENTS

| | | | |
|---|---|---|---|
| 2013/0256678 A1 | 10/2013 | Nishikawa | |
| 2014/0197414 A1 | 7/2014 | Guo | |
| 2015/0129881 A1 | 5/2015 | Kong et al. | |
| 2017/0357134 A1 | 12/2017 | Wang et al. | |
| 2019/0074305 A1 | 3/2019 | Gong et al. | |
| 2019/0123069 A1* | 4/2019 | Yang | H01L 29/66969 |
| 2020/0194469 A1* | 6/2020 | Hu | G02F 1/136286 |

FOREIGN PATENT DOCUMENTS

| | | | |
|---|---|---|---|
| CN | 106847744 A | 6/2017 |
| CN | 107731679 A | 2/2018 |
| CN | 109755260 A | 5/2019 |
| CN | 109904211 A | 6/2019 |

\* cited by examiner

ARRAY SUBSTRATE, DISPLAY PANEL, AND MANUFACTURING METHOD OF THE ARRAY SUBSTRATE

CROSS-REFERENCE TO RELATED APPLICATION

The present application claims a priority of the Chinese patent application No. 201910817146.8 filed on Aug. 30, 2019, which is incorporated herein by reference in its entirety.

TECHNICAL FIELD

The present disclosure relates to the field of display technology, in particular to an array substrate, a display panel, and a method for manufacturing the array substrate.

BACKGROUND

As an important component of a display panel, an array substrate plays a decisive role in display accuracy of the display panel.

In order to improve the display accuracy, a density of metallic lines in the array substrate may increase inevitably, and this requires to provide each metallic line with a smaller width. However, in order to meet the requirement on the signal transmission using the metallic line, usually a thickness of the metallic line needs to be increased.

Due to an increase in the thickness of the metallic line, in order to completely cover the metallic line with an insulation layer and thereby prevent the occurrence of a short circuit, a thickness of the insulation layer may increase to some extent. An increase in the thickness of the insulation layer adversely leads to a longer etching, thereby resulting in such problems as residual photoresist, incomplete etching and residues in a hole. Hence, a lapping defect occurs between the metal in the hole and the other conductive material.

SUMMARY

In one aspect, the present disclosure provides in some embodiments an array substrate, including: an insulation layer; and one or more stepped holes each penetrating through the insulation layer in a direction perpendicular to the insulation layer. Each stepped hole includes a first hole and a second hole under the first hole, a radius of the first hole at a bottom is a first radius, a radius of the second hole at a top is a second radius which is substantially smaller than the first radius, and a difference between the first radius and the second radius is 0.2 µm to 0.6 µm.

In some possible embodiments of the present disclosure, an overall gradient angle of each stepped hole is 50° to 75°.

In some possible embodiments of the present disclosure, a thickness of the insulation layer is greater than or equal to 0.6 µm, and a diameter of the second hole at a bottom is 4 µm to 8 µm.

In some possible embodiments of the present disclosure, a depth of the first hole is a first depth and a depth of the second hole is a second depth. When the first depth is substantially greater than the second depth, a gradient angle of the first hole is substantially smaller than a gradient angle of the second hole.

In some possible embodiments of the present disclosure, a depth of the first hole is a first depth and a depth of the second hole is a second depth. When the first depth is substantially smaller than the second depth, a gradient angle of the first hole is substantially greater than a gradient angle of the second hole.

In some possible embodiments of the present disclosure, the array substrate further includes a first film layer arranged under the insulation layer and a second film layer arranged on the insulation layer. The first film layer is an active layer including a plurality of active islands, and each active island includes a source electrode contact region and a drain electrode contact region. The one or more stepped holes include a first stepped hole and a second stepped hole. The second film layer is a source/drain conductive layer including source electrodes and drain electrodes. Each source electrode is connected to the source electrode contact region of the corresponding active island via lapping metal filled in the first stepped hole, and each drain electrode is connected to the drain electrode contact region of the corresponding active island via lapping metal filled in the second stepped hole.

In some possible embodiments of the present disclosure, the array substrate further includes a first film layer arranged under the insulation layer and a second film layer arranged on the insulation layer. The first film layer is a source/drain conductive layer including source electrodes and drain electrodes, the second film layer is an electrode layer including a plurality of electrode units, and each electrode unit is connected to the corresponding drain electrode via lapping metal filled in each stepped hole.

In some possible embodiments of the present disclosure, when the array substrate is applied to a liquid crystal display panel, the electrode layer is a pixel electrode layer, and each electrode unit is a pixel electrode corresponding to one subpixel.

In some possible embodiments of the present disclosure, when the array substrate is applied to an Organic Light-Emitting Diode (OLED) display panel, the electrode layer is an anode layer, and each electrode unit is an anode corresponding to one subpixel.

In some possible embodiments of the present disclosure, the first hole is coaxial with the second hole.

In some possible embodiments of the present disclosure, the first hole and the second hole of each stepped hole form a telescope shape.

In some possible embodiments of the present disclosure, the first hole and the second hole of each stepped hole form a sleeve structure.

In some possible embodiments of the present disclosure, each stepped hole further includes one or more third holes between the first hole and the second hole, a radius of each third hole at a bottom is substantially greater than the second radius, and a radius of each third hole at a top is substantially smaller than the first radius.

In another aspect, the present disclosure provides in some embodiments a display panel, including an array substrate. The array substrate includes: an insulation layer; and one or more stepped holes each penetrating through the insulation layer in a direction perpendicular to the insulation layer. Each stepped hole includes a first hole and a second hole under the first hole, a radius of the first hole at a bottom is a first radius, a radius of the second hole at a top is a second radius which is substantially smaller than the first radius, and a difference between the first radius and the second radius is 0.2 µm to 0.6 µm.

In yet another aspect, the present disclosure provides in some embodiments a method for manufacturing an array substrate, including: forming an insulation layer; and patterning the insulation layer to form one or more stepped holes each penetrating through the insulation layer in a direction perpendicular to the insulation layer. The patterning the insulation layer to form the one or more stepped holes each penetrating through the insulation layer in the direction perpendicular to the insulation layer includes: forming a first photoresist layer on the insulation layer, and exposing and developing the first photoresist layer with an exposure mask plate in a first exposure condition, so as to remove a part of the first photoresist layer, thereby to expose a first to-be-etched region of the insulation layer; dry-etching the first to-be-etched region of the insulation layer in a first process condition to form a first hole, and removing the remaining first photoresist layer; forming a second photoresist layer on the insulation layer, and exposing and developing the second photoresist layer with the exposure mask plate in a second exposure condition, so as to remove a part of the second photoresist layer, thereby to expose a second to-be-etched region of the insulation layer, the second photoresist layer being made of a material different from the first photoresist layer and/or the second exposure condition being different from the first exposure condition so that the second to-be-etched region is located within the first to-be-etched region and an area of the second to-be-etched region is smaller than an area of the first to-be-etched region; and dry-etching the second to-be-etched region of the insulation layer in a second process condition to form a second hole, and removing the remaining second photoresist layer. Each stepped hole includes the first hole and the second hole under the first hole, a radius of the first hole at a bottom is a first radius, a radius of the second hole at a top is a second radius which is substantially smaller than the first radius, and a difference between the first radius and the second radius is 0.2 μm to 0.6 μm.

In some possible embodiments of the present disclosure, the exposing and developing the second photoresist layer with the exposure mask plate in the second exposure condition so as to remove a part of the second photoresist layer includes: aligning the exposure mask plate with the array substrate using the first hole as an alignment mark; and exposing and developing the second photoresist layer in the second exposure condition so as to remove a part of the second photoresist layer.

In some possible embodiments of the present disclosure, parameters of the first process condition and parameters of the second process condition are controlled in such a manner as to provide each stepped hole with an overall gradient angle of 50° to 75°.

In some possible embodiments of the present disclosure, a depth of the first hole is a first depth and a depth of the second hole is a second depth. When the first depth is substantially greater than the second depth, etching power of the first process condition is controlled to be substantially smaller than etching power of the second process condition, so as to enable a gradient angle of the first hole to be substantially smaller than a gradient angle of the second hole.

In some possible embodiments of the present disclosure, a depth of the first hole is a first depth and a depth of the second hole is a second depth. When the first depth is substantially smaller than the second depth, etching power of the first process condition is controlled to be substantially greater than etching power of the second process condition, so as to enable a gradient angle of the first hole to be substantially greater than a gradient angle of the second hole.

In some possible embodiments of the present disclosure, when the exposure mask plate is aligned with the array substrate, a metallic structure that has been formed before the insulation layer of the array substrate is taken as an alignment mark.

BRIEF DESCRIPTION OF THE DRAWINGS

The above and/or other aspects and advantages of the present disclosure will become apparent and understandable through the following description in conjunction with the drawings. In these drawings.

Figure 1:
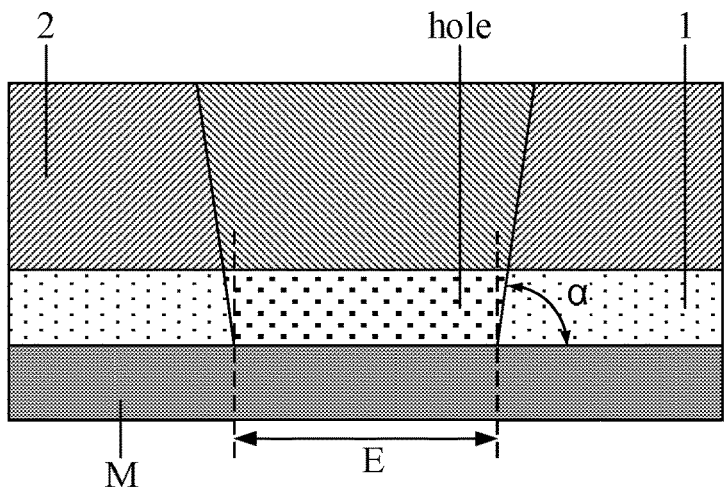
FIG. 1 is a topical sectional view of a conventional array substrate.

REFERENCE SIGN LIST 1 insulation layer
11 stepped hole
11/1 first stepped hole
11/2 second stepped hole
111 first hole
112 second hole
2 photoresist layer 2a first photoresist layer
2b second photoresist layer
3 first film layer
3a active layer
31a active island
311a source electrode contact region
312a drain electrode contact region
313a channel region
3b source/drain conductive layer
31b source electrode
32 drain electrode
4 second film layer
4a source/drain conductive layer
41a source electrode
42a drain electrode
4b electrode layer
41b electrode unit

DETAILED DESCRIPTION

The present disclosure will be described hereinafter in conjunction with the embodiments and the drawings. Identical or similar reference numbers in the drawings represent an identical or similar element or elements having an identical or similar function. In addition, when detailed description about the known technology is unnecessary for the features in the embodiments of the present disclosure, it may be omitted. The following embodiments are for illustrative purposes only, but shall not be used to limit the scope of the present disclosure.

It should be appreciated that, unless otherwise defined, any technical or scientific term used herein shall have the common meaning understood by a person of ordinary skills. It should be further appreciated that, any term defined in a commonly-used dictionary shall be understood as having the meaning in conformity with that in the related art, shall not be interpreted idealistically and extremely.

Unless otherwise defined, such words as "one" or "one of" are merely used to represent the existence of at least one member, rather than to limit the number thereof. Such words as "include" or "including" intend to indicate that there are the features, integers, steps, operations, elements and/or assemblies, without excluding the existence or addition of one or more other features, integers, steps, operations, elements, assemblies and/or combinations thereof. In the case that one element is connected or coupled to another element, it may be directly connected or coupled to the other element, or an intermediate element may be arranged therebetween. At this time, the element may be connected or coupled to the other element in a wireless or wired manner. In addition, the expression "and/or" is used to indicate the existence of all or any one of one or more of listed items, or combinations thereof.

It is found through study that, in some specific cases, an array substrate is provided with a relatively thick insulation layer. For example, for the array substrate in a high-definition (e.g., 8 k) OLED display panel, in order to meet the requirement on the signal transmission, usually each metallic line has a thickness of 600 to 1000 nm. In order to cover the metallic line and thereby prevent the occurrence of a short circuit, the insulation layer needs to have a thickness of 600 to 1000 nm.

However, when the insulation layer having a large thickness is etched through a dry-etching process, such problems as incomplete etching, residual photoresist, damaged film layer due to the loss of the photoresist and lapping defect caused by residues in a hole may occur.

As shown in FIG. 1, the insulation layer 1 is formed on a metal layer M. Before the dry-etching, a photoresist layer 2 needs to be formed on the insulation layer 1, and a part of the photoresist layer needs to be removed so as to form a to-be-etched region 11, and then the insulation layer 1 is etched through a dry-etching process to form a hole. Due to a large thickness of the insulation layer 1 (e.g., 1 μm), a gradient angle α generated through the existing dry-etching process is usually greater than 80°. At this time, lapping metal is provided with a relatively large internal stress, and thus may easily be broken. Even when the etching is performed through several steps or an etching time is prolonged, it is still difficult to prevent the occurrence of the lapping defect. It is impossible to form stable electrical connection between a conductive structure of the metal layer 3 and a conductive structure of any other conductive film layer on the insulation layer 1, so the yield of the array substrate may be adversely affected.

An object of the present disclosure is to provide an array substrate and a method for manufacturing the array substrate, so as to solve the above problem.

The schemes in the present disclosure and how to solve the above problem using the schemes will be described hereinafter in more details.

Figure 2:
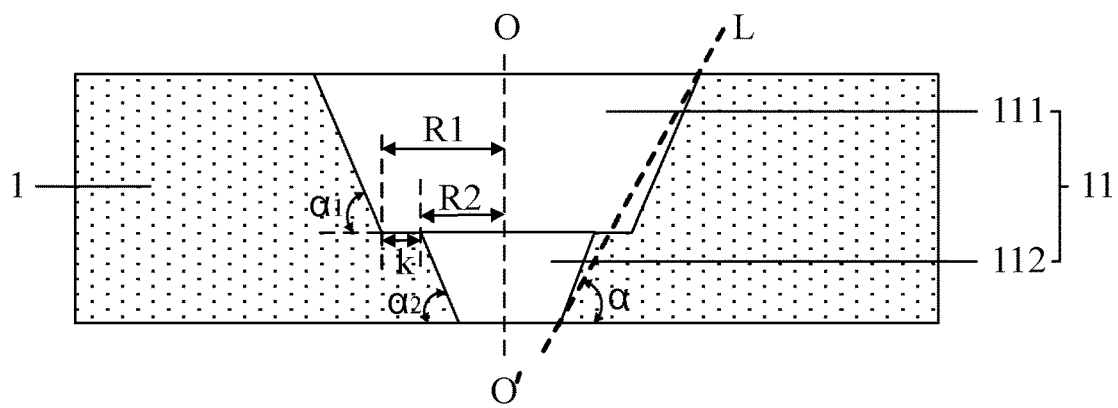
FIG. 2 is a topical sectional view of an insulation layer of an array substrate according to some embodiments of the present disclosure.

The present disclosure provides in some embodiments an array substrate which, as shown in FIG. 2, includes an insulation layer 1 and one or more stepped holes 11 each penetrating through the insulation layer 1.

Each stepped hole 11 may include a first hole 111 and a second hole 112 under the first hole 111, a radius of the first hole 111 at a bottom may be a first radius R1, a radius of the second hole 112 at a top may be a second radius R2 which is substantially smaller than the first radius R1, and a difference between the first radius R1 and the second radius R2 may be 0.2 μm to 0.6 μm.

It should be appreciated that, a dotted line O-O' in FIG. 2 is an axis of each stepped hole 11.

According to the array substrate in the embodiments of the present disclosure, through controlling the difference between the first radius and the second radius of each stepped hole to be within the range of 0.2 μm to 0.6 μm, i.e. controlling a width k of a step-like platform of each stepped hole to be within the range of 0.2 μm to 0.6 μm, it is able to increase a cushioning effect of the step-like platform on lapping metal, reduce an internal stress of the lapping metal, reduce the probability of the broken lapping metal and improve a lapping effect of the lapping metal, thereby to improve the yield of the array substrate. In addition, the difference between the first radius and the second radius of each stepped hole may be controlled within the range of 0.2 μm to 0.6 μm.

It should be appreciated that, the step-like platform may be a step-like surface of a step-like structure in each stepped hole 11. An upper step-like side surface is just a side surface of the first hole 111, and a lower step-like side surface is just a side surface of the second hole 112.

Referring again to FIG. 2, in some possible embodiments of the present disclosure, in the array substrate, an overall gradient angle α of each stepped hole 11 may be 50° to 75°. The overall gradient angle α of each stepped hole 11 in the embodiments of the present disclosure may be smaller than that in the related art (usually greater than 80°) to some extent, so it is able to reduce the difficulty in the deposition of the lapping metal, thereby to further reduce the probability of the broken lapping metal.

It should be appreciated that, the so-called overall gradient angle α refers to an angle of a step-like inner wall of each stepped hole 11 relative to a horizontal direction, i.e., an angle of a dotted line L in FIG. 2 relative to the horizontal direction. The dotted line L may intersect an edge of the top of the first hole 111 and an edge of the bottom of the second hole 112, and an orthogonal projection of the dotted line L onto a horizontal plane may pass through an orthogonal projection of a center point of the second hole 112 onto the horizontal plane.

Figure 3:
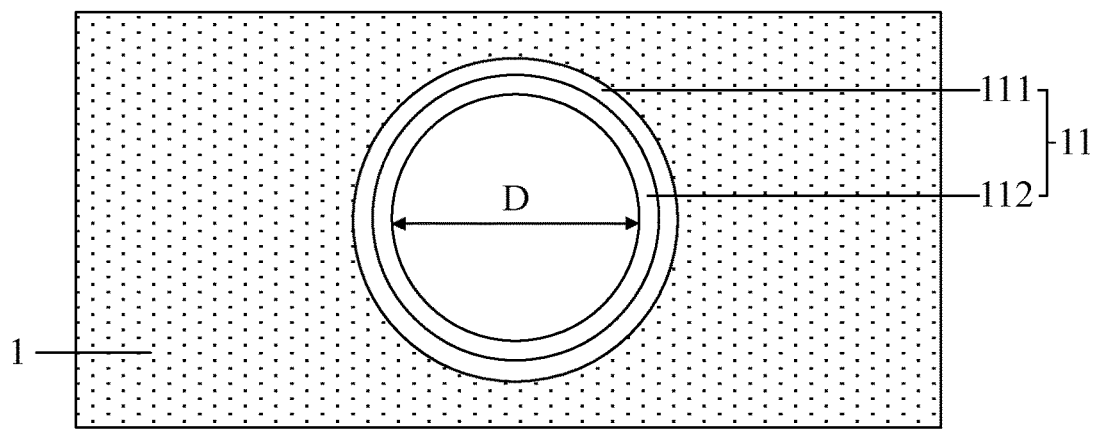
FIG. 3 is a topical top view of the insulation layer of the array substrate according to some embodiments of the present disclosure.

As shown in FIG. 3, in some possible embodiments of the present disclosure, when the array substrate in the embodiments of the present disclosure is applied to an OLED display panel or a liquid crystal display panel for high-definition display, in the array substrate, a thickness of the insulation layer 1 may be greater than or equal to 0.6 μm. To be specific, the thickness of the insulation layer 1 may be 0.6 μm to 1 μm. The insulation layer 1 may be made of one or more of silicon oxide, silicon oxynitride and silicon nitride.

Further, as shown in FIG. 3, a diameter of each stepped hole 11 at the bottom, i.e., a diameter D of the second hole 112 at the bottom, may be 4 μm to 8 μm, so as to be adapted to the high-definition display and reduce the difficult in the deposition of the lapping metal. In addition, it is able to prevent two adjacent stepped holes 11 from overlapping each other and prevent the lapping metal in the two adjacent stepped holes 11 from being connected to each other, thereby to prevent the occurrence of the short circuit between elements in the array substrate connected to the lapping metal.

Figure 4:
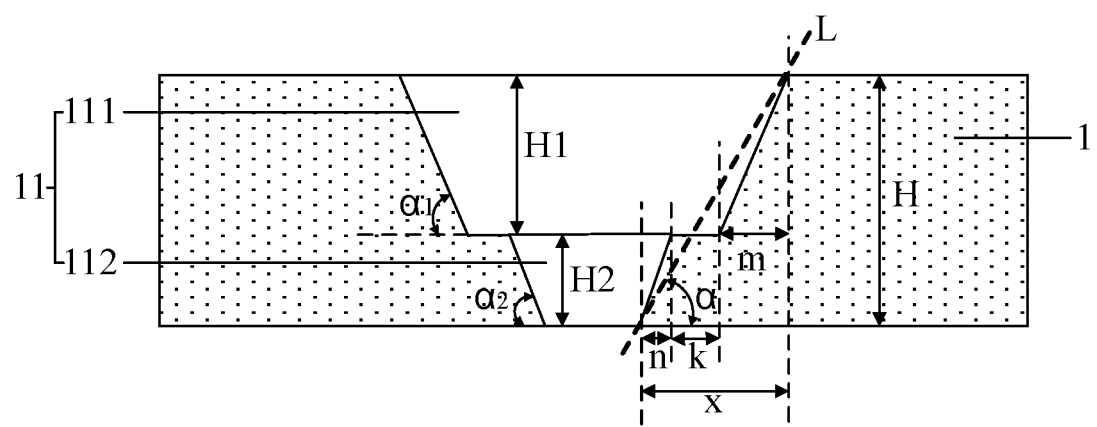
FIG. 4 is another topical sectional view of the insulation layer of the array substrate according to some embodiments of the present disclosure.

As shown in FIG. 4, in some possible embodiments of the present disclosure, in the array substrate, a depth of the first hole 111 may be a first depth H1, and a depth of the second hole 112 may be a second depth H2. When the first depth H1 is greater than the second depth H2, a gradient angle α1 of the first hole 111 may be smaller than a gradient angle α2 of the second hole 112. When the first depth H1 is smaller than the second depth H2, the gradient angle α1 of the first hole 111 may be greater than the gradient angle α2 of the second hole 112.

When the gradient angle α1 of the first hole 111 is designed as being different from the gradient angle α2 of the second hole 112, it is able to prevent the occurrence of an oversized overall gradient angle α caused by large values of α1 and α2, and prevent the occurrence of a relatively large radius of the first hole 11 at the top caused by small values of α1 and α2, thereby to prevent the two adjacent stepped holes 11 from overlapping each other and prevent the lapping metal within the two adjacent stepped holes 11 from being connected to each other.

To be specific, a total depth H of the stepped hole 11, i.e., the thickness of the insulation layer, may be constant, and the first depth H1 and the second depth H2 may be adjusted according to the practical design, resulting in a change in the overall gradient angle α. As shown in FIG. 4, a tangent of the overall gradient angle α, i.e., tan α, may be equal to H/x, and x=m+k+n, where m=H1/tan α1, n=H2/tan α2, and a value of k is not affected by the gradient angle. When the value of k has been determined, the larger the value of m+n, the smaller the value of tan α, i.e. the smaller the overall gradient angle α. When the depth of the first hole 111 is different from the depth of the second hole 112, the gradient angle of the hole having a larger depth (the first hole 111 or the second hole 112) may be designed as a smaller angle, so as to provide m+n with a larger value, i.e., to acquire a smaller overall gradient angle α.

In the embodiments of the present disclosure, through designing a small gradient angle of the first hole 111 or the second hole 112 with a larger depth, it is able to reduce the overall gradient angle α, thereby to further reduce the probability of the broken lapping metal.

Figure 5:
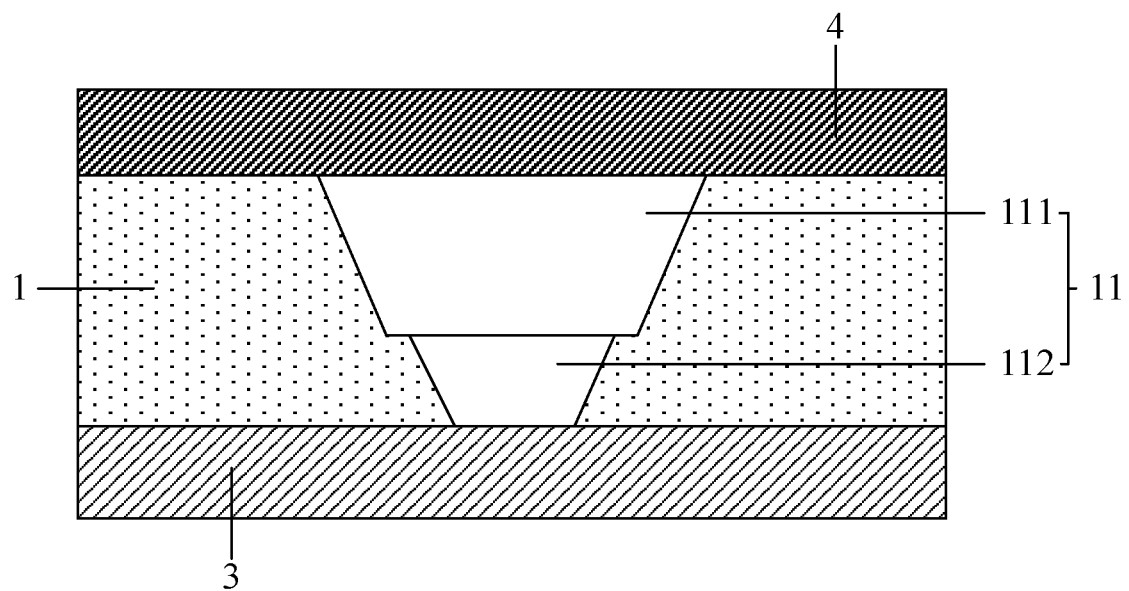
FIG. 5 is a topical sectional view of the array substrate according to some embodiments of the present disclosure.

As shown in FIG. 5, in some possible embodiments of the present disclosure, the array substrate may further include a first film layer 3 arranged under the insulation layer 1 and a second film layer 4 arranged on the insulation layer 1. To be specific, the first film layer 3 and the second film layer 4 may be different film layers in the array substrate, which will be described hereinafter in more details.

Figure 6:
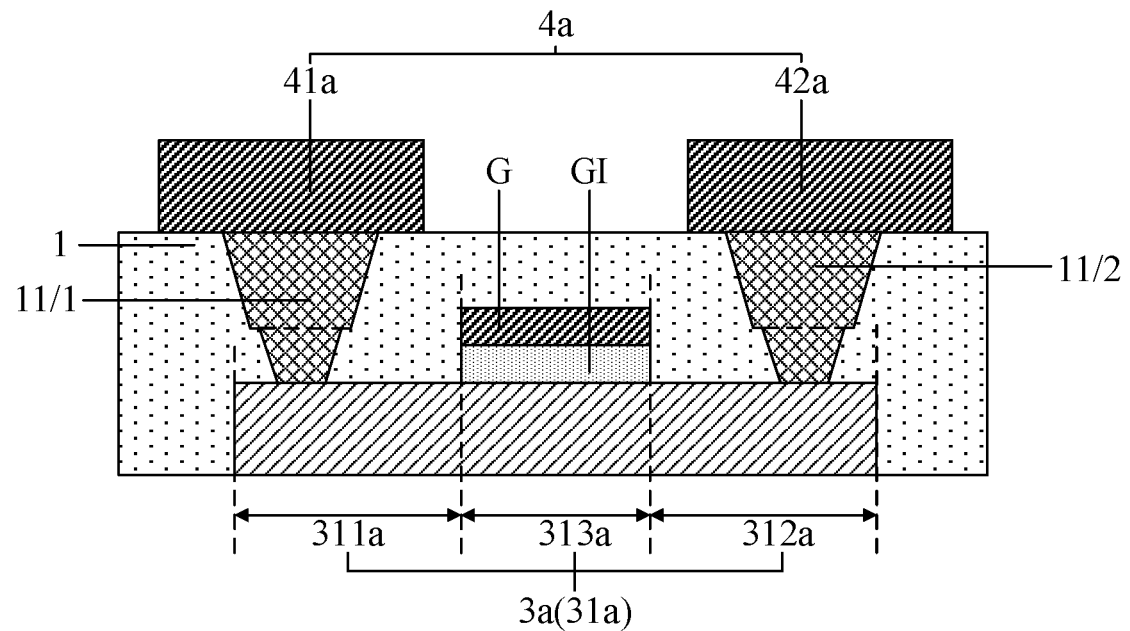
FIG. 6 is another topical sectional view of the array substrate according to some embodiments of the present disclosure.

As shown in FIG. 5 and FIG. 6, in some embodiments of the present disclosure, the first film layer 3 may be an active layer 3a including a plurality of active islands 31a, and each active island 31a may include a source electrode contact region 311a and a drain electrode contact region 312a. The one or more stepped holes 11 may include a first stepped hole 11/1 and a second stepped hole 11/2. The second film layer 4 may be a source/drain conductive layer 4a including source electrodes 41a and drain electrodes 42a. Each source electrode 41a may be connected to the source electrode contact region 311a of the corresponding active island 31a via lapping metal filled in the first stepped hole 11/1, and each drain electrode 42a may be connected to the drain electrode contact region 312a of the corresponding active island 31a via lapping metal filled in the second stepped hole 11/2.

It should be appreciated that, taking a top-gate thin film transistor in FIG. 6 as an example, each active island 31a may further include a channel 313a, a gate electrode G may be arranged on the channel 313a, and a gate insulation layer GI may be arranged between the gate electrode G and the active island 31a. Of course, the TFT may also be of a bottom-gate structure, which will not be particularly defined herein. The active layer 31a may be made of one or more of indium gallium zinc oxide (IGZO) and indium zinc oxide (IZO), or the active layer 31a may be made of a low-temperature polysilicon (LTPS) material.

Figure 7:
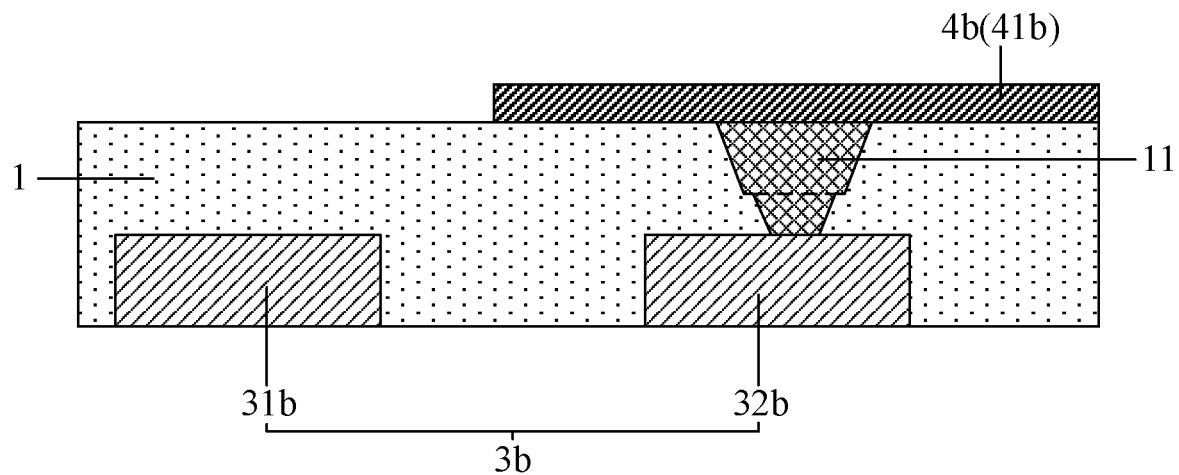
FIG. 7 is yet another topical sectional view of the array substrate according to some embodiments of the present disclosure.

As shown in FIG. 5 and FIG. 7, in some other embodiments of the present disclosure, the first film layer 3 may be a source/drain conductive layer 3b including source electrodes 31b and drain electrodes 32b, the second film layer 4 may be an electrode layer 4b including a plurality of electrode units 41b, and each electrode unit 41b may be connected to the corresponding drain electrode 32b via lapping metal filled in each stepped hole 11.

It should be appreciated that, in the array substrate applied to the liquid crystal display panel, the electrode layer 4b may be a pixel electrode layer, and each electrode unit 41b may be a pixel electrode corresponding to one subpixel. In addition, in the array substrate applied to the OLED display panel, the electrode layer 4b may be an anode layer, and each electrode unit 41b may be an anode corresponding to one subpixel.

Based on a same inventive concept, the present disclosure further provides in some embodiments a display pane which includes the above-mentioned array substrate. The display panel has the beneficial effect of the above-mentioned array substrate, which will thus not be particularly defined herein.

Figure 8:
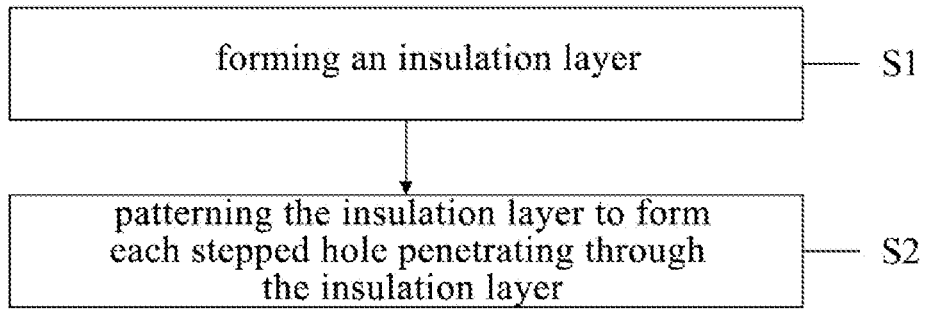
FIG. 8 is a flow chart of a method for manufacturing the array substrate according to some embodiments of the present disclosure.

Based on a same inventive concept, the present disclosure further provides in some embodiments a method for manufacturing an array substrate which, as shown in FIG. 8, includes the following steps.

S1: forming an insulation layer. To be specific, the insulation layer may be formed through vapor deposition, and it may be made of one or more of silicon oxide, silicon oxynitride and silicon nitride.

S2: patterning the insulation layer to form one or more stepped holes each penetrating through the insulation layer.

Figure 9:
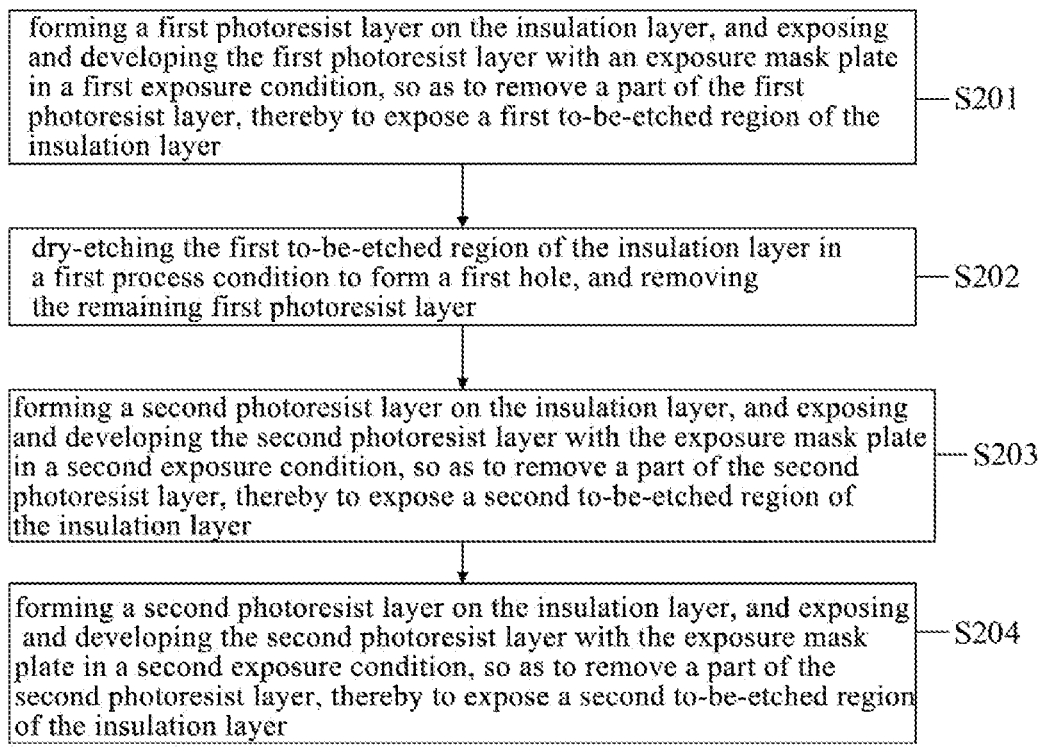
FIG. 9 is a flow chart of Step S2 in the method for manufacturing the array substrate according to some embodiments of the present disclosure.

As shown in FIG. 9, S2 may include the following steps.

Figure 10:
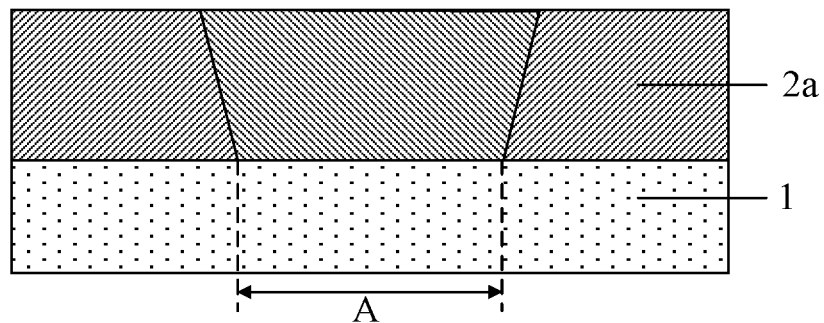
FIG. 10 is a schematic view showing a structure formed after Step S201 in the method for manufacturing the array substrate according to some embodiments of the present disclosure.

S201: as shown in FIG. 10, forming a first photoresist layer 2a on the insulation layer 1, and exposing and developing the first photoresist layer 2a with an exposure mask plate in a first exposure condition, so as to remove a part of the first photoresist layer 2a, thereby to expose a first to-be-etched region A of the insulation layer 1. To be specific, the first to-be-etched region A of the insulation layer 1 may be a region where a top of a first hole is located.

Figure 11:
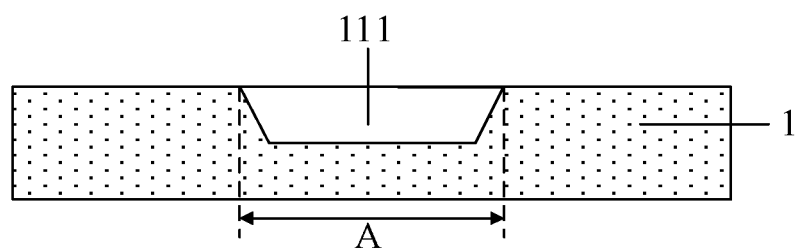
FIG. 11 is a schematic view showing a structure formed after Step 202 in the method for manufacturing the array substrate according to some embodiments of the present disclosure.

S202: as shown in FIG. 11, dry-etching the first to-be-etched region A of the insulation layer 1 in a first process condition to form the first hole 111, and removing the remaining first photoresist layer (not shown).

Figure 12:
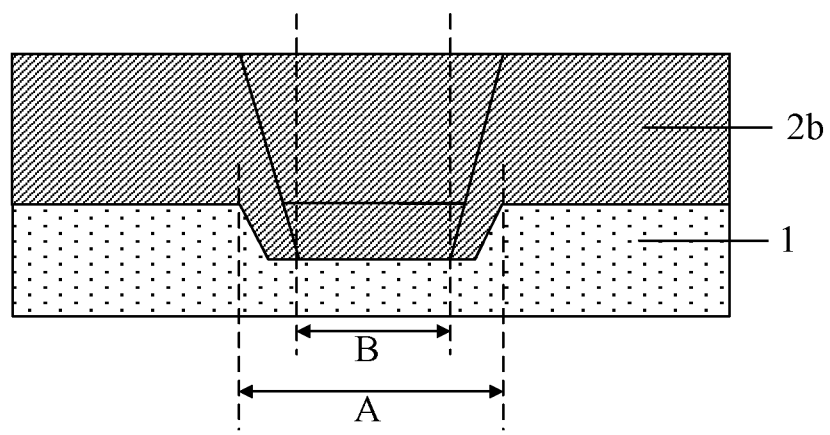
FIG. 12 is a schematic view showing a structure formed after Step 203 in the method for manufacturing the array substrate according to some embodiments of the present disclosure.

S203: as shown in FIG. 12, forming a second photoresist layer 2b on the insulation layer 1, and exposing and developing the second photoresist layer 2b with an exposure mask plate in a second exposure condition, so as to remove a part of the second photoresist layer 2b, thereby to expose a second to-be-etched region B of the insulation layer 1. The exposure mask plate in S203 may be the same as the exposure mask plate in S201. The second photoresist layer may be made of a material different from the first photoresist layer and/or the second exposure condition may be different from the first exposure condition, so that the second to-be-etched region B is located within the first to-be-etched region A and an area of the second to-be-etched region B is smaller than an area of the first to-be-etched region A. To be specific, the second to-be-etched region B may be a region where a top of a second hole is located.

Figure 13:
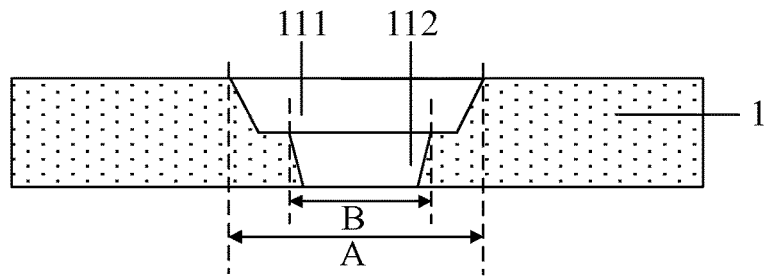
FIG. 13 is a schematic view showing a structure formed after Step 204 in the method for manufacturing the array substrate according to some embodiments of the present disclosure.

S204: as shown in FIG. 13, dry-etching the second to-be-etched region B of the insulation layer 1 in a second process condition to form the second hole 112, and removing the remaining second photoresist layer (not shown).

As shown in FIG. 2, each stepped hole 11 may include the first hole 111 and the second hole 112, the radius of the first hole 111 at the bottom may be the first radius R1, the radius of the second hole 112 at the top may be the second radius R2, and a difference between the first radius R1 and the second radius R2 may be 0.2 μm to 0.6 μm.

According to the method for manufacturing the array substrate in the embodiments of the present disclosure, through at least two exposure masking processes and at least two dry-etching processes, the materials of the second photoresist layer 2b and the first photoresist layer 2a may be selected and/or the second exposure condition and the first exposure condition may be adjusted, so as to adjust the areas of the first to-be-etched region A and the second to-be-etched region B when the same exposure mask plate is adopted in the at least two exposure masking processes, thereby to ensure that the first radius R1 is greater than the second radius R2 and the difference between the first radius R1 and the second radius R2 is within the range of 0.2 μm to 0.6 μm. As a result, it is able to increase a cushioning effect of the step-like platform on lapping metal, reduce an internal stress of the lapping metal, reduce the probability of the broken lapping metal and improve a lapping effect of the lapping metal, thereby to improve the yield of the array substrate.

To be specific, the first exposure condition and the second exposure condition may include same parameters, and the parameters may include one or more of exposure time, light wavelength, distance between a light source and the array substrate, and distance between the exposure mask plate and the array substrate. In other words, the exposure condition may be adjusted through changing one or more of the parameters.

Figure 14:
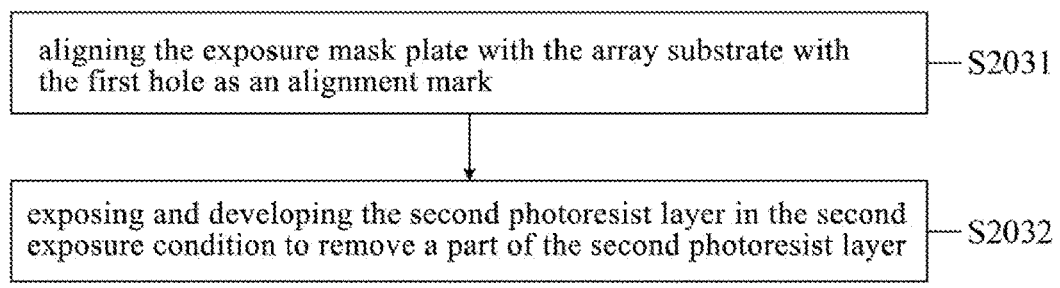
FIG. 14 is a flow chart of Step S203 in the method for manufacturing the array substrate according to some embodiments of the present disclosure.

In some possible embodiments of the present disclosure, as shown in FIG. 14, in S203, the exposing and developing the second photoresist layer 2b with the exposure mask plate in the second exposure condition so as to remove a part of the second photoresist layer may include: S2031 of aligning the exposure mask plate with the array substrate using the first hole 111 as an alignment mark; and S2032 of exposing and developing the second photoresist layer 2b in the second exposure condition so as to remove a part of the second photoresist layer.

In the method for manufacturing the array substrate in the embodiments of the present disclosure, during the alignment of the exposure mask plate with the array substrate for the second time, the first hole 111 may be used as the alignment mark, so as to remarkably improve the alignment accuracy, e.g., control the alignment accuracy to be smaller than 1 μm. Hence, it is able to easily control an etching offset (affected by the alignment accuracy) to be smaller than 1.5 μm, which is smaller than the requirement on the etching offset for high-definition display in the related art (the etching offset is required to be controlled to be smaller than 2 μm in the related art). In other words, when the first hole is used as the alignment mark, it is able to improve the etching accuracy.

It should be appreciated that, in S201, the first photoresist layer may be exposed and developed with the exposure mask plate to remove a part of the first photoresist layer, and during the alignment of the exposure mask plate with the array substrate, a metallic structure that has been formed before the insulation layer of the array substrate may be taken as an alignment mark. For example, a part of a gate metal layer may be taken as the alignment mark. Of course, a specific alignment mark may be formed on the array substrate. The alignment mark will not be particularly defined herein, as long as the exposure mask plate is capable of aligned with the array substrate when the first photoresist layer is exposed and developed.

In some possible embodiments of the present disclosure, as shown in FIG. 2, parameters of the first process condition and parameters of the second process condition may be controlled in such a manner as to provide each stepped hole 11 with an overall gradient angle α of 50° to 75°. To be specific, the parameters of the first process condition may be the same as those of the second process condition, and these parameters may include one or more of types of etching gases, a flow rate of the etching gas, an etching time and etching power. To be specific, the etching gases may include one or more of $CF_4$, $SF_6$ and $O_2$.

Further, as shown in FIG. 4, a depth of the first hole 111 may be a first depth H1 and a depth of the second hole 112 may be a second depth H2. When the first depth H1 is substantially greater than the second depth H2, the etching power of the first process condition may be controlled to be substantially smaller than the etching power of the second process condition, so as to enable a gradient angle α1 of the first hole 111 to be substantially smaller than a gradient angle α2 of the second hole 112. In addition, when the first depth H1 is substantially smaller than the second depth H2, the etching power of the first process condition may be controlled to be substantially greater than the etching power of the second process condition, so as to enable the gradient angle α1 of the first hole 111 to be substantially greater than a gradient angle α2 of the second hole 112.

In the embodiments of the present disclosure, through designing a small gradient angle of the first hole 111 or the second hole 112 with a larger depth, it is able to reduce the overall gradient angle α, thereby to further reduce the probability of the broken lapping metal.

Figure 15:
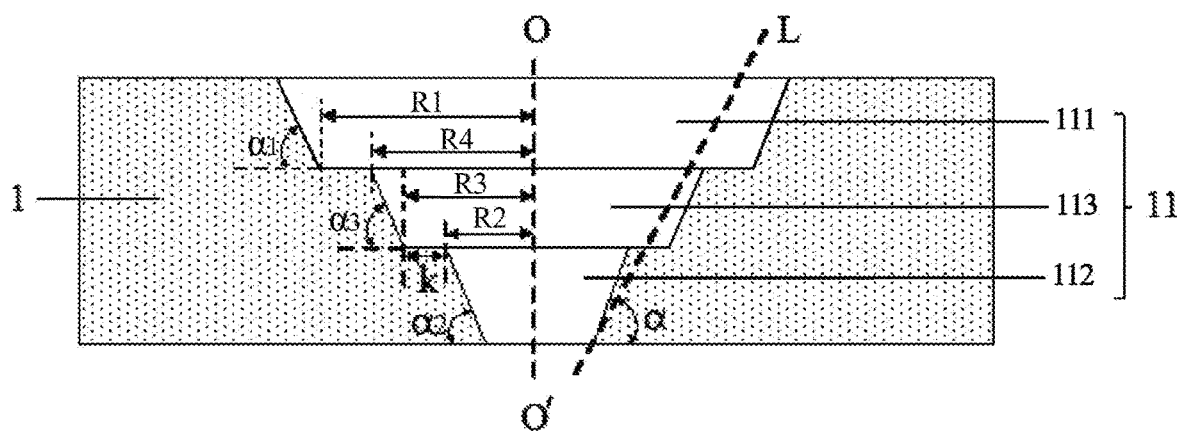
FIG. 15 is another topical sectional view of the insulation layer of the array substrate according to some embodiments of the present disclosure.

In addition, on the basis of FIG. 2, the array substrate 1 in FIG. 15 may also be acquired. In FIG. 15, each stepped hole 11 may further include one or more third holes 113 between the first hole 111 and the second hole 112, a radius R3 of each third hole 111 at a bottom may be substantially greater than the second radius R2, and a radius R4 of each third hole 113 at a top may be substantially smaller than the first radius R1.

The present disclosure at least has the following beneficial effects. According to the array substrate, the display panel and the method for manufacturing the array substrate in the embodiments of the present disclosure, through at least two exposure masking processes and at least two dry-etching processes, the difference between the first radius and the second radius of the stepped hole penetrating through the insulation layer may be controlled within the range of 0.2 μm to 0.6 μm, i.e., the width of the step-like platform may be controlled to be within the range of 0.2 μm to 0.6 μm. As a result, it is able to increase a cushioning effect of the step-like platform on the lapping metal, reduce an internal stress of the lapping metal, reduce the probability of the broken lapping metal and improve a lapping effect of the lapping metal, thereby to improve the yield of the array substrate.

It should be appreciated that, steps, measures and schemes in various operations, methods and processes that have already been discussed in the embodiments of the present disclosure may be replaced, modified, combined or deleted. In some possible embodiments of the present disclosure, the other steps, measures and schemes in various operations, methods and processes that have already been discussed in the embodiments of the present disclosure may also be replaced, modified, rearranged, decomposed, combined or deleted. In another possible embodiment of the present disclosure, steps, measures and schemes in various operations, methods and processes that are known in the related art and have already been discussed in the embodiments of the present disclosure may also be replaced, modified, rearranged, decomposed, combined or deleted.

It should be further appreciated that, such words as "center", "on", "under", "front", "back", "left", "right", "vertical", "horizontal", "top", "bottom", "inner" and "outer" are used to indicate directions or positions as viewed in the drawings, and they are merely used to facilitate the description in the present disclosure, rather than to indicate or imply that a device or member must be arranged or operated at a specific position.

In addition, such words as "first" and "second" may merely be adopted to differentiate different features rather than to implicitly or explicitly indicate any number or importance, i.e., they may be adopted to implicitly or explicitly indicate that there is at least one said feature. Further, such a phrase as "a plurality of" may be adopted to indicate that there are two or more features, unless otherwise specified.

Unless otherwise specified, such words as "arrange" and "connect" may have a general meaning, e.g., the word "connect" may refer to fixed connection, removable connection or integral connection, or mechanical or electrical connection, or direct connection or indirect connection via an intermediate component, or communication between two components, or wired or wireless communication connection. The meanings of these words may be understood by a person skilled in the art in accordance with the practical need.

In the above description, the features, structures, materials or characteristics may be combined in any embodiment or embodiments in an appropriate manner.

It should be further appreciated that, although with arrows, the steps in the flow charts may not be necessarily performed in an order indicated by the arrows. Unless otherwise defined, the order of the steps may not be strictly defined, i.e., the steps may also be performed in another order. In addition, each of at least parts of the steps in the flow charts may include a plurality of sub-steps or stages, and these sub-steps or stages may not be necessarily performed at the same time, i.e., they may also be performed at different times. Furthermore, these sub-steps or stages may not be necessarily performed sequentially, and instead, they may be performed alternately with the other steps or at least parts of sub-steps or stages of the other steps.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising:
   an insulation layer; and
   one or more stepped holes each penetrating through the insulation layer in a direction perpendicular to the insulation layer,
   wherein each stepped hole comprises a first hole and a second hole under the first hole, a radius of the first hole at a bottom is a first radius, a radius of the second hole at a top is a second radius which is substantially smaller than the first radius, and a difference between the first radius and the second radius is 0.2 μm to 0.6 μm.

2. The array substrate according to claim 1, wherein an overall gradient angle of each stepped hole is 50° to 75°.

3. The array substrate according to claim 1, wherein a thickness of the insulation layer is greater than or equal to 0.6 μm, and a diameter of the second hole at a bottom is 4 μm to 8 μm.

4. The array substrate according to claim 1, wherein a depth of the first hole is a first depth and a depth of the second hole is a second depth, wherein when the first depth is substantially greater than the second depth, a gradient angle of the first hole is substantially smaller than a gradient angle of the second hole.

5. The array substrate according to claim 4, further comprising:
   a first film layer arranged under the insulation layer; and
   a second film layer arranged on the insulation layer,
   wherein the first film layer is an active layer comprising a plurality of active islands, each active island comprises a source electrode contact region and a drain electrode contact region, the one or more stepped holes comprise a first stepped hole and a second stepped hole, the second film layer is a source/drain conductive layer comprising source electrodes and drain electrodes, each source electrode is connected to the source electrode contact region of the corresponding active island via lapping metal filled in the first stepped hole, and each drain electrode is connected to the drain electrode contact region of the corresponding active island via lapping metal filled in the second stepped hole.

6. The array substrate according to claim 4, further comprising:
   a first film layer arranged under the insulation layer; and a second film layer arranged on the insulation layer,
wherein the first film layer is a source/drain conductive layer comprising source electrodes and drain electrodes, the second film layer is an electrode layer comprising a plurality of electrode units, and each electrode unit is connected to the corresponding drain electrode via lapping metal filled in each stepped hole.

7. The array substrate according to claim 6, wherein when the array substrate is applied to a Liquid Crystal Display (LCD) panel, the electrode layer is a pixel electrode layer, and each electrode unit is a pixel electrode corresponding to one subpixel.

8. The array substrate according to claim 6, wherein when the array substrate is applied to an Organic Light-Emitting Diode (OLED) display panel, the electrode layer is an anode layer, and each electrode unit is an anode corresponding to one subpixel.

9. The array substrate according to claim 1, wherein a depth of the first hole is a first depth and a depth of the second hole is a second depth, wherein when the first depth is substantially smaller than the second depth, a gradient angle of the first hole is substantially greater than a gradient angle of the second hole.

10. The array substrate according to claim 1, wherein the first hole is coaxial with the second hole.

11. The array substrate according to claim 1, wherein the first hole and the second hole of each stepped hole form a telescope shape.

12. The array substrate according to claim 1, wherein the first hole and the second hole of each stepped hole form a sleeve structure.

13. The array structure according to claim 1, wherein each stepped hole further comprises one or more third holes between the first hole and the second hole, a radius of each third hole at a bottom is substantially greater than the second radius, and a radius of each third hole at a top is substantially smaller than the first radius.

14. A display panel, comprising an array substrate, wherein the array substrate comprises an insulation layer and one or more stepped holes each penetrating through the insulation layer in a direction perpendicular to the insulation layer, each stepped hole comprises a first hole and a second hole under the first hole, a radius of the first hole at a bottom is a first radius, a radius of the second hole at a top is a second radius which is substantially smaller than the first radius, and a difference between the first radius and the second radius is 0.2 µm to 0.6 µm.

15. A method for manufacturing an array substrate, comprising:
forming an insulation layer; and
patterning the insulation layer to form one or more stepped holes each penetrating through the insulation layer in a direction perpendicular to the insulation layer,
wherein the patterning the insulation layer to form the one or more stepped holes each penetrating through the insulation layer in the direction perpendicular to the insulation layer comprises:
forming a first photoresist layer on the insulation layer, and exposing and developing the first photoresist layer with an exposure mask plate in a first exposure condition, so as to remove a part of the first photoresist layer, thereby to expose a first to-be-etched region of the insulation layer;
dry-etching the first to-be-etched region of the insulation layer in a first process condition to form a first hole, and removing the remaining first photoresist layer;
forming a second photoresist layer on the insulation layer, and exposing and developing the second photoresist layer with the exposure mask plate in a second exposure condition, so as to remove a part of the second photoresist layer, thereby to expose a second to-be-etched region of the insulation layer, the second photoresist layer being made of a material different from the first photoresist layer and/or the second exposure condition being different from the first exposure condition so that the second to-be-etched region is located within the first to-be-etched region and an area of the second to-be-etched region is smaller than an area of the first to-be-etched region; and
dry-etching the second to-be-etched region of the insulation layer in a second process condition to form a second hole, and removing the remaining second photoresist layer,
wherein each stepped hole comprises the first hole and the second hole under the first hole, a radius of the first hole at a bottom is a first radius, a radius of the second hole at a top is a second radius which is substantially smaller than the first radius, and a difference between the first radius and the second radius is 0.2 µm to 0.6 µm.

16. The method according to claim 15, wherein the exposing and developing the second photoresist layer with the exposure mask plate in the second exposure condition so as to remove a part of the second photoresist layer comprises:
aligning the exposure mask plate with the array substrate using the first hole as an alignment mark; and
exposing and developing the second photoresist layer in the second exposure condition so as to remove a part of the second photoresist layer.

17. The method according to claim 16, wherein when the exposure mask plate is aligned with the array substrate, a metallic structure that has been formed before the insulation layer of the array substrate is taken as an alignment mark.

18. The method according to claim 15, wherein parameters of the first process condition and parameters of the second process condition are controlled in such a manner as to provide each stepped hole with an overall gradient angle of 50° to 75°.

19. The method according to claim 15, wherein a depth of the first hole is a first depth and a depth of the second hole is a second depth, wherein when the first depth is substantially greater than the second depth, etching power of the first process condition is controlled to be substantially smaller than etching power of the second process condition, so as to enable a gradient angle of the first hole to be substantially smaller than a gradient angle of the second hole.

20. The method according to claim 15, wherein a depth of the first hole is a first depth and a depth of the second hole is a second depth, and wherein when the first depth is substantially smaller than the second depth, etching power of the first process condition is controlled to be substantially greater than etching power of the second process condition, so as to enable a gradient angle of the first hole to be substantially greater than a gradient angle of the second hole.

* * * * *